(12) United States Patent
Watatani et al.

(10) Patent No.: US 7,544,535 B2
(45) Date of Patent: Jun. 9, 2009

(54) METHOD FOR MANUFACTURING SEMICONDUCTOR LASER ELEMENT

(75) Inventors: Chikara Watatani, Tokyo (JP); Toru Ota, Tokyo (JP); Takashi Nagira, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 114 days.

(21) Appl. No.: 11/625,617

(22) Filed: Jan. 22, 2007

(65) Prior Publication Data

US 2008/0032435 A1   Feb. 7, 2008

(30) Foreign Application Priority Data

Aug. 1, 2006   (JP) .............................. 2006-209744

(51) Int. Cl.
*H01L 21/00* (2006.01)
(52) U.S. Cl. ...................... 438/93; 438/94; 438/412; 438/681; 438/761; 438/763
(58) Field of Classification Search .................. 438/7, 438/39, 94, 222, 412, 416, 681, 761, 763; 257/79–103
See application file for complete search history.

(56) References Cited

U.S. PATENT DOCUMENTS 6,821,801 B1 * 11/2004 Sato et al. ..................... 438/22

2003/0062517 A1 * 4/2003 Ryder et al. .................. 257/12

FOREIGN PATENT DOCUMENTS

| JP | 5-136526 | 6/1993 |
| JP | 8-148752 | 6/1996 |
| JP | 2001-94212 | 4/2001 |
| JP | 2002-368339 | 12/2002 |
| JP | 2002-368339 A | * 12/2002 |

OTHER PUBLICATIONS

S. Gouraud, et al., "High Speed AlGaInAs Multiple-Quantum-Well Electroabsorption Modulator Buried and Planarized with Semi-insulating Fe-Doped InP grown by Chloride assisted LP-MOVPE", Proceedings, 17$^{th}$ Int. Conf. on IPRM, May 2005, 4 pages.

* cited by examiner

*Primary Examiner*—Thao X Le
*Assistant Examiner*—Eric W Jones
(74) *Attorney, Agent, or Firm*—Oblon, Spivak, McClelland, Maier & Neustadt, P.C.

(57) ABSTRACT

The method for manufacturing a semiconductor laser element according to the present invention has the steps of: forming a semiconductor laminated structure having an active layer composed of a semiconductor material containing Al; etching the semiconductor laminated structure to form a mesa; forming a first burying layer at a first growing temperature so as to coat the side of the mesa; and forming a second burying layer at a second growing temperature higher than the first growing temperature on the first burying layer to bury the circumference of the mesa.

7 Claims, 4 Drawing Sheets

METHOD FOR MANUFACTURING SEMICONDUCTOR LASER ELEMENT

BACKGROUND OF THE INVENTION

1. Field of the Invention

The present invention relates to a method for manufacturing a semiconductor laser element wherein a semiconductor laminated structure having an active layer is etched to form a mesa, and the circumference of the mesa is buried with a burying layer.

2. Background Art

In a semiconductor laser element, the current pathway must be narrowed to efficiently supply a current to the active layer. Therefore, in many semiconductor lasers, after fabricating a semiconductor laminated structure having an active layer, a mesa is formed using a technique to transfer micropatterns to an insulative film and an etching technique to limit the region where a current flows, and to narrow the current pathway. At this time, from the standpoint of the protection of the active layer exposed on the side of the mesa, heat dissipation, or the parasitic capacity of the element, a buried structure wherein the circumference of the mesa is buried with semiconductors is formed (e.g., refer to Japanese Patent Laid-Open No. 05-136526).

FIG. 10 is a sectional view showing a semiconductor laser element wherein the circumference of the mesa in a semiconductor laminated structure having an active layer is buried with a structure laminated by n-type semiconductor layer, p-type semiconductor layer, n-type semiconductor layer and p-type semiconductor layer. A mesa of a semiconductor laminated structure wherein a p-type InP clad layer 12, an AlGaInAs lower optical confinement layer 13, an AlGaInAs-MQW active layer 14, an n-type AlGaInAs upper optical confinement layer 15, and an n-type InP clad layer 16 are sequentially grown on a p-type InP substrate 11, is formed. The circumference of the mesa is buried with a p-type InP burying layer 17, an n-type InP current blocking layer 18, a p-type InP burying layer 19, and an n-type InP burying layer 20. Thereon, an n-type InP contact layer 21, an n-type InGaAs contact layer 22, and an n-type InP cap layer 23 are formed.

Here, the side of the mesa must be coated with the p-type InP burying layer 17. This is because if the n-type InP current blocking layer 18 contacts the mesa, a current flows from the mesa to the burying layers, and the current to the active layer 14 cannot be narrowed.

The growth of the p-type InP burying layer 17 on the side of the mesa is much influenced by the surface state and the shape of the side of the mesa, which becomes the burying boundary. For example, the mesa has various shapes depending on the etching method and conditions for forming the mesa, or semiconductor material composing the mesa, and an inversely tapered portion may be formed on the side of the mesa. Since crystals are not grown on the inversely tapered portion, the inversely tapered portion is not coated with the p-type InP burying layer 19 in the initial stage of burying growth, and growth so as to coat the inversely tapered portion begins after the portion below the inversely tapered portion has been completely buried.

Therefore, there was a problem wherein the n-type InP current blocking layer 18 contacted the mesa, and an invalid current pathway 24 wherein a current flowed from the mesa to the burying layers was formed as FIG. 11 shows. To prevent the formation of the invalid current pathway, the etching conditions had to be reviewed for each device structure or semiconductor material composing the mesa, so that the shape of the mesa most suited to the burying growth was obtained.

In addition, in the mesa composed of Al-containing semiconductor materials, the Al on the side of the mesa was oxidized when it was exposed to the atmosphere, causing the inhibition of burying growth, and defective burying, such as pitted growth, easily occurred. There was another problem wherein oxygen or impurities in the boundaries caused crystal defect, and in turn caused the deterioration of the semiconductor element. For these reasons, the burying growth of a mesa composed of Al-containing semiconductor materials was difficult.

SUMMARY OF THE INVENTION

To solve the above-described problems, it is an object of the present invention to provide a method for manufacturing a semiconductor laser element that can prevent the formation of an invalid current pathway wherein a current flows from the mesa to burying layers.

According to one aspect of the present invention, a method for manufacturing a semiconductor laser element according to the present invention has the steps of: forming a semiconductor laminated structure having an active layer composed of a semiconductor material containing Al; etching the semiconductor laminated structure to form a mesa; forming a first burying layer at a first growing temperature so as to coat the side of the mesa; and forming a second burying layer at a second growing temperature higher than the first growing temperature on the first burying layer to bury the circumference of the mesa.

According to the present invention, the formation of an invalid current pathway wherein current flows from the mesa to the burying layer can be prevented.

Other and further objects, features and advantages of the invention will appear more fully from the following description.

DETAILED DESCRIPTION OF THE PREFERRED EMBODIMENTS

First Embodiment

Figure 1:
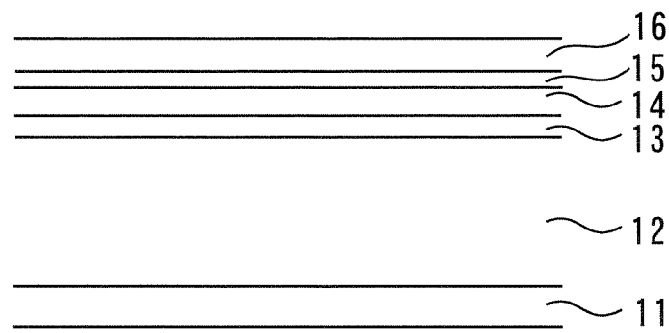
FIG. 1 is a sectional view for explaining a method of manufacturing a semiconductor laser element according to First Embodiment of the present invention.

The method for manufacturing a semiconductor laser element according to the first embodiment of the present invention will be described below referring to the drawings.

First, as FIG. 1 shows, a p-type InP clad layer 12, an AlGaInAs lower optical confinement layer 13, an AlGaInAs-MQW active layer 14, an n-type AlGaInAs upper optical confinement layer 15, and an n-type InP clad layer 16 are sequentially grown on a p-type InP substrate 11 using crystal growth by metal organic vapor phase epitaxy (MOVPE) to form a semiconductor laminated structure having an active layer composed of an Al-containing semiconductor material, $Al_xGa_yIn_{1-x-y}As$ ($0<x<1$, $0<y<1$).

Figure 2:
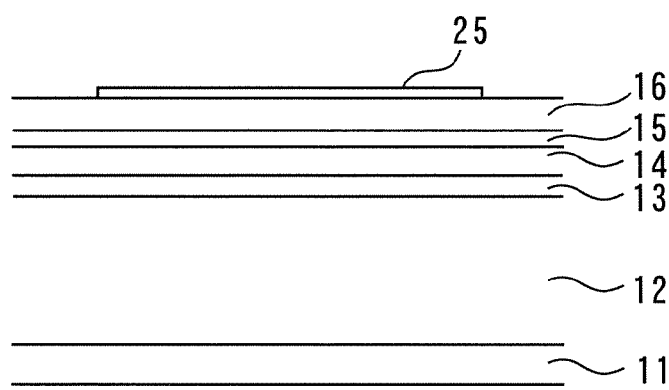
FIG. 2 is a sectional view for explaining a method of manufacturing a semiconductor laser element according to First Embodiment of the present invention.
Figure 3:
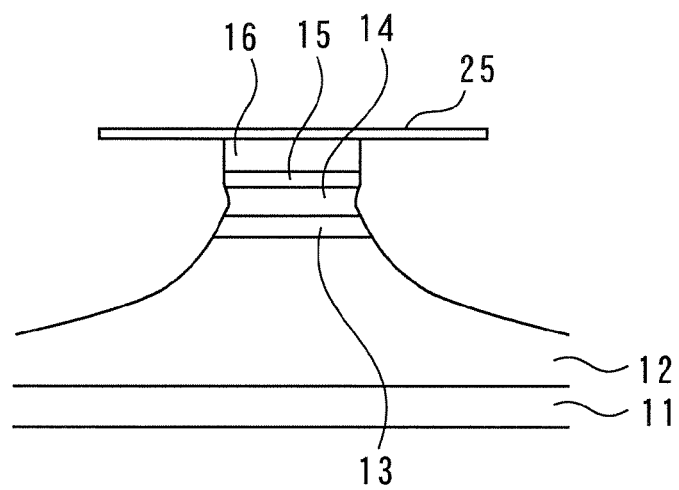
FIG. 3 is a sectional view for explaining a method of manufacturing a semiconductor laser element according to First Embodiment of the present invention.

Next, as FIG. 2 shows, the wafer is taken out from the MOVPE apparatus, an $SiO_2$ film is formed on the wafer to fabricate an $SiO_2$ mask 25 using photo lithograpy and transfer processes. Then, wet etching is performed using the $SiO_2$ mask 25 as a mask to form a mesa of the semiconductor laminated structure as shown in FIG. 3. At this time, an inversely tapered portion may be formed on the side of the mesa due to difference of the semiconductor layers to be etched or etching conditions.

Figure 4:
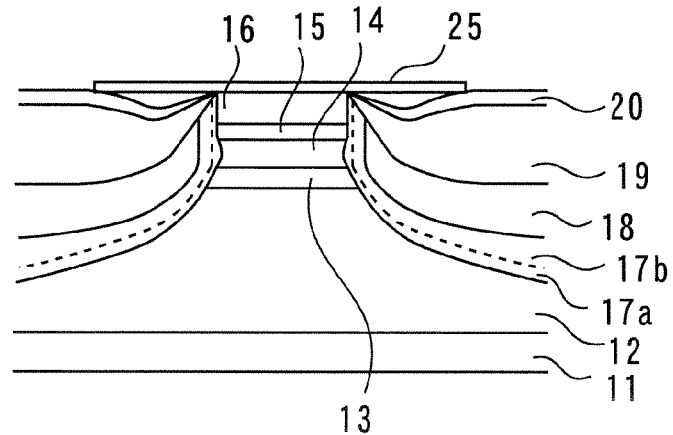
FIG. 4 is a sectional view for explaining a method of manufacturing a semiconductor laser element according to First Embodiment of the present invention.

Next, the wafer on which the mesa has been formed is placed again in the MOVPE apparatus, and as FIG. 4 shows, a p-type InP first burying layer 17a (first burying layer) is formed at a growing temperature of Tg_p1 (first growing temperature) so as to coat the side of the mesa, and on the p-type InP first burying layer 17a, a p-type InP second burying layer 17b, an n-type InP current blocking layer 18, a p-type InP burying layer 19, and an n-type InP burying layer 20 (second burying layer) are formed at a growing temperature of Tg_p2 (second growing temperature) to bury the circumference of the mesa.

Figure 5:
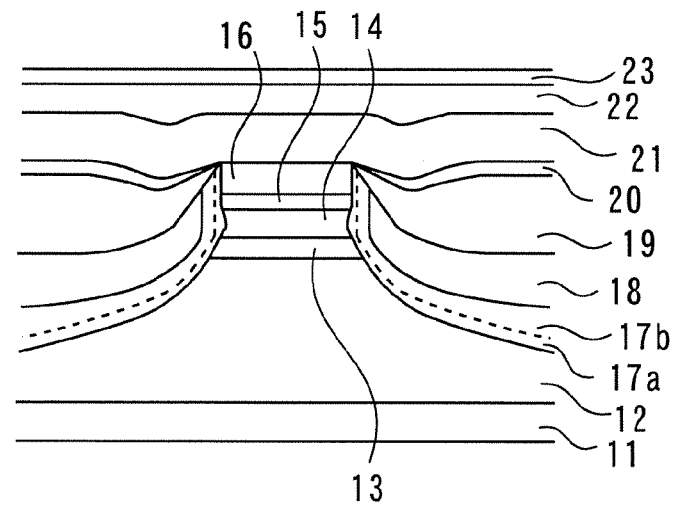
FIG. 5 is a sectional view for explaining a method of manufacturing a semiconductor laser element according to First Embodiment of the present invention.

Next, as FIG. 5 shows, the wafer is taken out from the MOVPE apparatus, and the mask 25 is etched off. Thereafter the wafer is placed again in the MOVPE apparatus, and an n-type InP contact layer 21, an n-type InGaAs contact layer 22, and an n-type InP cap layer 23 are formed. By the above-described manufacturing process, a semiconductor laser element having an n/p/n/p buried structure is manufactured.

Figure 6:
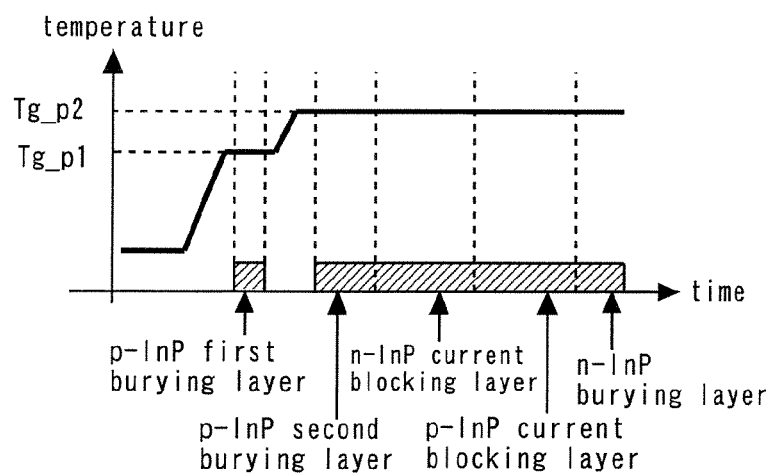
FIG. 6 is a diagram schematically showing the growing temperature and the transition of time of the growth of layers in burying and growing in the first embodiment.

Here, FIG. 6 is a diagram schematically showing the growing temperature and the transition of time of the growth of layers in burying and growing in the first embodiment. As FIG. 6 shows, the growing temperature Tg_p1 for the p-type InP first burying layer 17a is lower than the growing temperature Tg_p2 for the p-type InP second burying layer 17b (Tg_p1<Tg_p2). It is preferable in view of crystal qualities that the growing temperatures for the layers other than the p-type InP first burying layer 17a are within a range between 600° C. and 630° C., which is the to be optimal for InP growth by MOVPE.

As described above, since the growing temperature Tg_p1 for the p-type InP first burying layer 17a contacting the mesa is lower than the growing temperature Tg_p2 for the p-type InP second burying layer 17b, the migration of growing species on the side of the mesa is suppressed, and the inversely tapered portion of the mesa is also coated with the p-type InP first burying layer 17a. Thereby, since the n-type InP current blocking layer 18 can be grown without contacting the mesa, the formation of an invalid current pathway can be prevented.

In the first embodiment, although the p-type InP burying layer is divided into two burying layers, the p-type InP first burying layer 17a and the p-type InP second burying layer 17b, the p-type InP burying layer can be divided into more than two (n) layers. At this time, the growing temperature Tg_p1 for the p-type InP first burying layer 17a should be lower than the growing temperature Tg_pm for the p-type InP mth burying layer ($1<m<n$).

Although growth is interrupted between the growth of the p-type InP first burying layer 17a and the growth of the p-type InP second burying layer 17b, the growing temperatures of the burying growth can be continuously elevated from Tg_p1 to Tg_p2 while growing from the p-type InP first burying layer 17a to the p-type InP second burying layer 17b without interrupting growth.

The present invention is not limited to the burying growth of a structure laminated by n-type semiconductor layer, p-type semiconductor layer, n-type semiconductor layer and p-type semiconductor layer, but can be applied to any burying growth. The present invention can also be applied to the burying growth of a mesa in a semiconductor laminated structure composed of any semiconductor materials, such as InP, AlGaInAs, InGaAs, InGaAsP, AlInAs, AlGaAs, GaAs, AlGaInP, InGaP, AlGaN, GaN, and InGaN. The optimal growing temperatures for the growth of these semiconductor materials are: 600 to 630° C. for InP, InGaAsP, and InGaAs; 600 to 750° C. for AlGaInAs and AlInAs; 650 to 750° C. for AlGaAs, GaAs, AlGaInP and InGaP; 1000 to 1100° C. for AlGaN and GaN; and 700 to 800° C. for InGaN. When the present invention is applied to the burying growth using these materials, it is desirable that the growing temperature of the first burying layer is lower than these optimal growing temperatures. The present invention can be applied not only to the fabrication of a semiconductor laser, but also to the fabrication of any semiconductor elements, such as a modulator and a photo detector.

Second Embodiment

Figure 7:
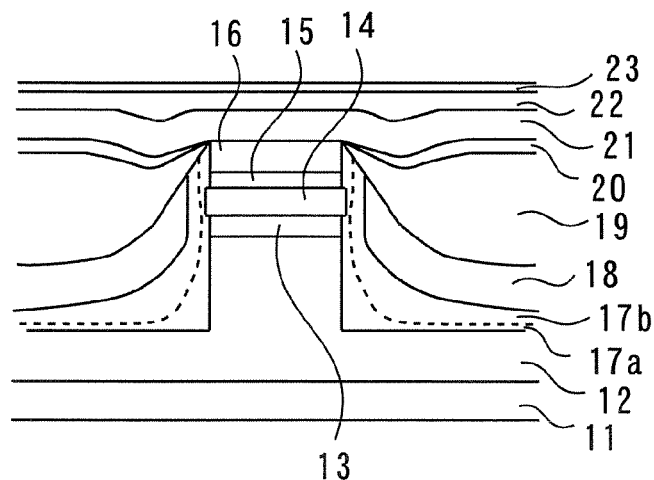
FIG. 7 is a sectional view showing a semiconductor laser element manufactured using the manufacturing method according to the second embodiment of the present invention.

FIG. 7 is a sectional view showing a semiconductor laser element manufactured using the manufacturing method according to the second embodiment of the present invention. The second embodiment differs from the first embodiment in that the mesa is formed by dry etching, and the shape of the mesa differs from that of the first embodiment. Other constitutions, for example, the sequence of burying growth and the temperature setting for burying growth, are the same as in the first embodiment.

Also in a mesa having a different shape formed by dry etching, the migration of the growing species can be suppressed by growing the first burying layer at a low temperature, and the side of the mesa having an inversely tapered portion can be coated. Thereby, since an n-type InP current blocking layer 18 can be grown without contacting the mesa, the formation of an invalid current pathway can be prevented.

Third Embodiment

The method for manufacturing a semiconductor laser element according to the third embodiment of the present invention will be described below referring to the drawings. First, as in the first embodiment, and as FIGS. 1 to 3 show, a semiconductor laminated structure having an active layer composed of an Al-containing semiconductor material, $Al_xGa_yIn_{1-x-y}As$ (0<x<1, 0<y<1) is formed, and then, the semiconductor laminated structure is etched to form a mesa.

Figure 8:
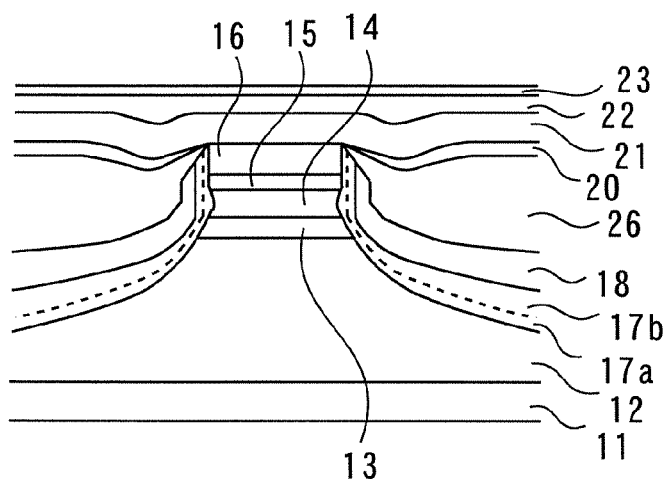
FIG. 8 is a sectional view for explaining a method of manufacturing a semiconductor laser element according to Third Embodiment of the present invention.

Next, the wafer on which the mesa has been formed is placed again in the MOVPE apparatus and the side of the mesa is cleaned by HCl gas, which has an etching effect. Thereafter, as FIG. 8 shows, a p-type InP first burying layer 17a (first burying layer) is formed at a growing temperature of Tg_p1 (first growing temperature) so as to coat the side of the mesa, and on the p-type InP first burying layer 17a, a p-type InP second burying layer 17b, an n-type InP current blocking layer 18, an Fe—InP current blocking layer 26, and an n-type InP burying layer 20 (second burying layer) are formed at a growing temperature of Tg_p2 (second growing temperature) to bury the circumference of the mesa. Then, the wafer is taken out from the MOVPE apparatus and the mask 25 is etched off. Thereafter, the wafer is placed in the MOVPE apparatus again, and an n-type InP contact layer 21, an n-type InGaAs contact layer 22, and an n-type InP cap layer 23 are grown. By the above-described manufacturing process, a semiconductor laser element having a buried structure laminated by n-type semiconductor layer, Fe-doped semiconductor layer, n-type semiconductor layer and p-type semiconductor layer is manufactured.

Figure 9:
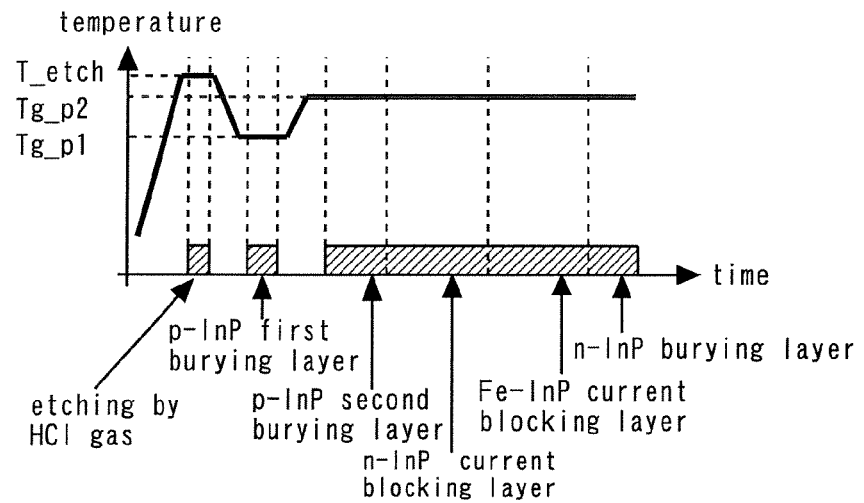
FIG. 9 is a diagram schematically showing the growing temperature and the transition of time of the growth of layers in burying and growing in the third embodiment.
Figure 10:
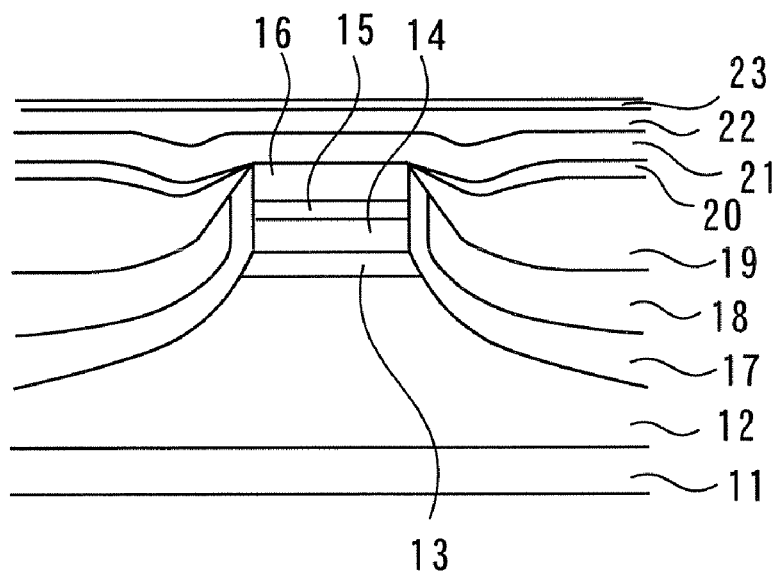
FIG. 10 is a sectional view showing a semiconductor laser element wherein the circumference of the mesa in a semiconductor laminated structure having an active layer is buried with a structure laminated by n-type semiconductor layer, p-type semiconductor layer, n-type semiconductor layer and p-type semiconductor layer.
Figure 11:
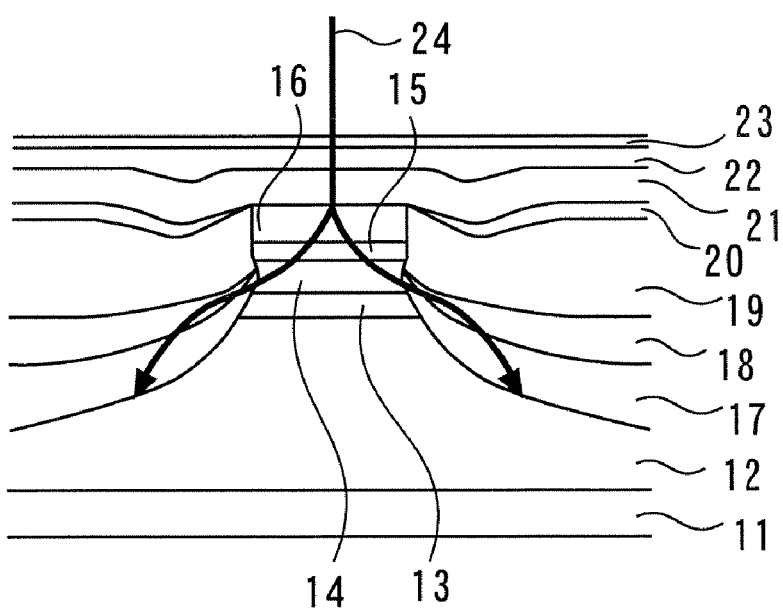
FIG. 11 is a sectional view showing a semiconductor laser element wherein an invalid current pathway wherein a current flowed from the mesa to the burying layers was formed.

Here, FIG. 9 is a diagram schematically showing the growing temperature and the transition of time of the growth of layers in burying and growing in the third embodiment. As FIG. 9 shows, the wafer is heated to the etching temperature T_etch, and the etching process is carried out by introducing HCl gas. Then, the temperature is lowered to the growing temperature Tg_p1 of the p-type InP first burying layer 17a. Here, the temperature T_etch of the etching process using HCl gas is higher than the growing temperature Tg_p1 of the p-type InP first burying layer 17a (T_etch>Tg_p1). Thereby, the firm oxide film on the side of an AlGaInAs layer exposed on the side of the mesa at the time of the formation of the mesa becomes easy to remove.

Also as in the first embodiment, since the growing temperature Tg_p1 of the p-type InP first burying layer 17a contacting the mesa is lower than the growing temperature Tg_p2 of the p-type InP second burying layer 17b, the migration of the growing species on the side of the mesa is suppressed, and the side of the active layer composed of an oxidizable AlGaInAs material can coat the circumference of the mesa without defective burying, such as pitted growth. Thereby, since the n-type InP current blocking layer 18 or the Fe—InP current blocking layer can be grown without contacting the mesa, the formation of an invalid current pathway can be prevented.

In the third embodiment, although HCl gas is used, other gases having an etching effect, such as TBCl and $CCl_4$ can also be used in the etching step before burying growth. The present invention is not limited to the burying growth of a structure laminated by n-type semiconductor layer, Fe-doped semiconductor layer, n-type semiconductor layer and p-type semiconductor layer, but can be applied to any burying growth.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2006-209744, filed on Aug. 1, 2006 including specification, claims, drawings and summary, on which the Convention priority of the present application is based, are incorporated herein by reference in its entirety.

What is claimed is:

1. A method for manufacturing a semiconductor laser element comprising:
    forming a semiconductor laminated structure;
    etching the semiconductor laminated structure to form a mesa;
    forming a p-type first burying layer at a first growing temperature so as to coat the side of the mesa; and
    forming a p-type second burying layer at a second growing temperature higher than the first growing temperature to continuously and completely coat the p-type first burying layer to bury the circumference of the mesa;
    wherein the semiconductor laminated structure comprises:
    an active layer comprising a semiconductor material containing Al on a substrate.

2. The method for manufacturing a semiconductor laser element according to claim 1, wherein the growing temperature is stepwise elevated from the first growing temperature to the second growing temperature.

3. The method for manufacturing a semiconductor laser element according to claim 1, wherein the growing temperature is continuously elevated from the first growing temperature to the second growing temperature.

4. The method for manufacturing a semiconductor laser element according to claim 1, further comprising:
    forming a n-type InP current blocking layer on the p-type second burying layer,
    forming a p-type InP burying layer on the n-type InP current blocking layer, and
    forming a n-type InP burying layer on the p-type burying layer on the n-type current blocking layer.

5. A method for manufacturing a semiconductor laser element comprising:
    forming a semiconductor laminated structure having an active layer on a substrate;
    etching the semiconductor laminated structure to form a mesa;
    cleaning the side of the mesa using a gas having an etching effect;
    forming a p-type first burying layer at a first growing temperature so as to coat the side of the mesa after cleaning the side of the mesa; and
    forming a p-type second burying layer at a second growing temperature higher than the first growing temperature to continuously and completely coat the p-type first burying layer to bury the circumference of the mesa.

6. The method for manufacturing a semiconductor laser element according to claim 5, wherein the side of the mesa is cleaned at a temperature higher than the first growing temperature.

7. The method for manufacturing a semiconductor laser element according to claim 5, further comprising:
    forming a n-type InP current blocking layer on the p-type second burying layer,
    forming a p-type InP burying layer on the n-type InP current blocking layer, and
    forming a n-type InP burying layer on the p-type burying layer on the n-type current blocking layer.

* * * * *